(12) United States Patent
Ryuji et al.

(10) Patent No.: US 7,928,646 B2
(45) Date of Patent: Apr. 19, 2011

(54) ORGANIC ELECTROLUMINESCENT DISPLAY WITH IMPROVED BARRIER STRUCTURE

(75) Inventors: Nishikawa Ryuji, Hsinchu (TW); Hsiang-Lun Hsu, Miaoli (TW)

(73) Assignee: Chimei Innolux Corporation, Chu-Nan (TW)

( * ) Notice: Subject to any disclaimer, the term of this patent is extended or adjusted under 35 U.S.C. 154(b) by 364 days.

(21) Appl. No.: 12/009,502

(22) Filed: Jan. 17, 2008

(65) Prior Publication Data

US 2008/0211399 A1    Sep. 4, 2008

(30) Foreign Application Priority Data

Jan. 22, 2007   (TW) ............................. 96102276 A

(51) Int. Cl.
*H01J 1/62* (2006.01)
*H01J 63/04* (2006.01)
*H05B 33/00* (2006.01)

(52) U.S. Cl. .......... 313/501; 313/507; 313/512; 445/24; 445/25

(58) Field of Classification Search ........... 313/501–512
See application file for complete search history.

(56) References Cited

U.S. PATENT DOCUMENTS

| 2005/0156513 A1* | 7/2005 | Sano et al. ..................... 313/504 |
| 2006/0152151 A1* | 7/2006 | Seo ............................... 313/506 |
| 2007/0015429 A1* | 1/2007 | Maeda et al. .................. 445/24 |
| 2007/0096636 A1* | 5/2007 | Park et al. ..................... 313/503 |

FOREIGN PATENT DOCUMENTS

TW          200637417        10/2006

* cited by examiner

*Primary Examiner* — Nimeshumar D Patel
*Assistant Examiner* — Tracie Green
(74) *Attorney, Agent, or Firm* — Liu & Liu

(57) ABSTRACT

An organic electroluminescent display device and fabrication method thereof is provided. The device includes a first substrate having at least one thin film transistor; an electroluminescent unit formed on the first substrate and electrically connect to the thin film transistor; a first protective layer formed on the electroluminescent unit; a second protective layer formed on the first protective layer; and a third protective layer formed on the second protective layer and in contact with the first protective layer. The device further comprises a second substrate sealed to the first substrate to form the electroluminescent unit between the first substrate and second substrate. In the device, the first protective layer comprising inorganic material, the second protective layer comprising organic material and the third protective layer comprising inorganic material are formed on the electroluminescent unit to reduce oxidation of electrodes by preventing infiltration of moisture.

11 Claims, 15 Drawing Sheets

ORGANIC ELECTROLUMINESCENT DISPLAY WITH IMPROVED BARRIER STRUCTURE

BACKGROUND OF THE INVENTION

1. Field of the Invention

The invention relates to organic electroluminescent display devices, and more particularly to an organic electroluminescent display device having improved waterproof capabilities and a fabrication method thereof.

2. Description of the Related Art

Organic electroluminescent display devices possess advantages of improved color, viewing angle, brightness and reduced size when compared with conventional displays, such as cathode ray tube (CRT) displays or liquid crystal displays (LCD). Thus, demand for organic electroluminescent display devices is increasing. Organic electroluminescent display devices are however easily affected by moisture, such as oxidation of electrodes and components, shortening life. Thus, encapsulated structures and fabrication of organic electroluminescent display devices is important.

FIG. 1 shows a conventional organic electroluminescent display device. A first electrode 12 is formed on a first substrate 10. Thereafter, an organic electroluminescent layer 14 and a second electrode 16 are sequentially formed on the first electrode 12 followed by covering a protective layer 18 on the second electrode 16. Finally, a second substrate 20 is disposed on the first substrate 10. The waterproof ability of the device suffers due to the use of only a single protective layer. Furthermore, a total thickness of the device is increased when the protective layer is increased.

Thus, an organic electroluminescent display device having improved waterproof ability without increasing thickness and method for fabricating is needed.

BRIEF SUMMARY OF INVENTION

The invention provides organic electroluminescent display devices. An exemplary embodiment of the device comprises a first substrate having at least one thin film transistor (TFT); an electroluminescent unit formed on the first substrate and electrically connected to the thin film transistor; a first protective layer formed on the electroluminescent unit; a second protective layer formed on the first protective layer; and a third protective layer formed on the second protective layer and in contact with the first protective layer. The device further comprises a second substrate sealed to the first substrate forming the electroluminescent unit between the first substrate and second substrate.

The device further comprises a top area of the second protective layer in contact with the third protective layer greater than or equal to a bottom area of the second protective layer in contact with the first protective layer.

The device further comprises a distance between top edges of the second protective layer in contact with the third protective layer greater than or equal to a distance between bottom edges of the second protective layer in contact with the first protective layer.

The invention further provides a method for fabricating an organic electroluminescent display device. The method comprises providing a first substrate having at least one thin film transistor; forming an electroluminescent unit on the first substrate and electrically connected to the thin film transistor; forming a first protective layer on the electroluminescent unit; forming a second protective layer on the first protective layer; and forming a third protective layer on the second protective layer and in contact with the first protective layer. The method further comprises the second protective layer is formed by ink-jet printing (IJP) or screen printing.

The organic electroluminescent display device effectively prevents infiltration of moisture into the electroluminescent unit for reducing oxidation of electrodes. Because the first protective layer comprises inorganic material, the second protective layer comprises organic material and the third protective layer comprises inorganic material are formed on the electroluminescent unit moisture infiltration is prevented. Additionally, stress between the first protective layer comprising inorganic material and the third protective layer comprising inorganic material is relieved by the second protective layer comprising organic material formed therebetween. Further the second protective layer is only formed in a recess over the electroluminescent unit, thus, fabrication cost is reduced. The second protective layer formed in the recess over the electroluminescent unit provides improved organic electroluminescent display device waterproof capability is without increasing total thickness. Accordingly, life of the organic electroluminescent display device is increased.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

FIG. 2A through FIG. 2H, show cross-sectional views of forming an organic electroluminescent display device according to a first embodiment of the invention. In this embodiment, a color filter and thin film transistor serving as a switch may be disposed on the same substrate in the organic electroluminescent display device. That is, the color filter may be formed on the substrate on which the thin film transistor is formed.

Figure 1:
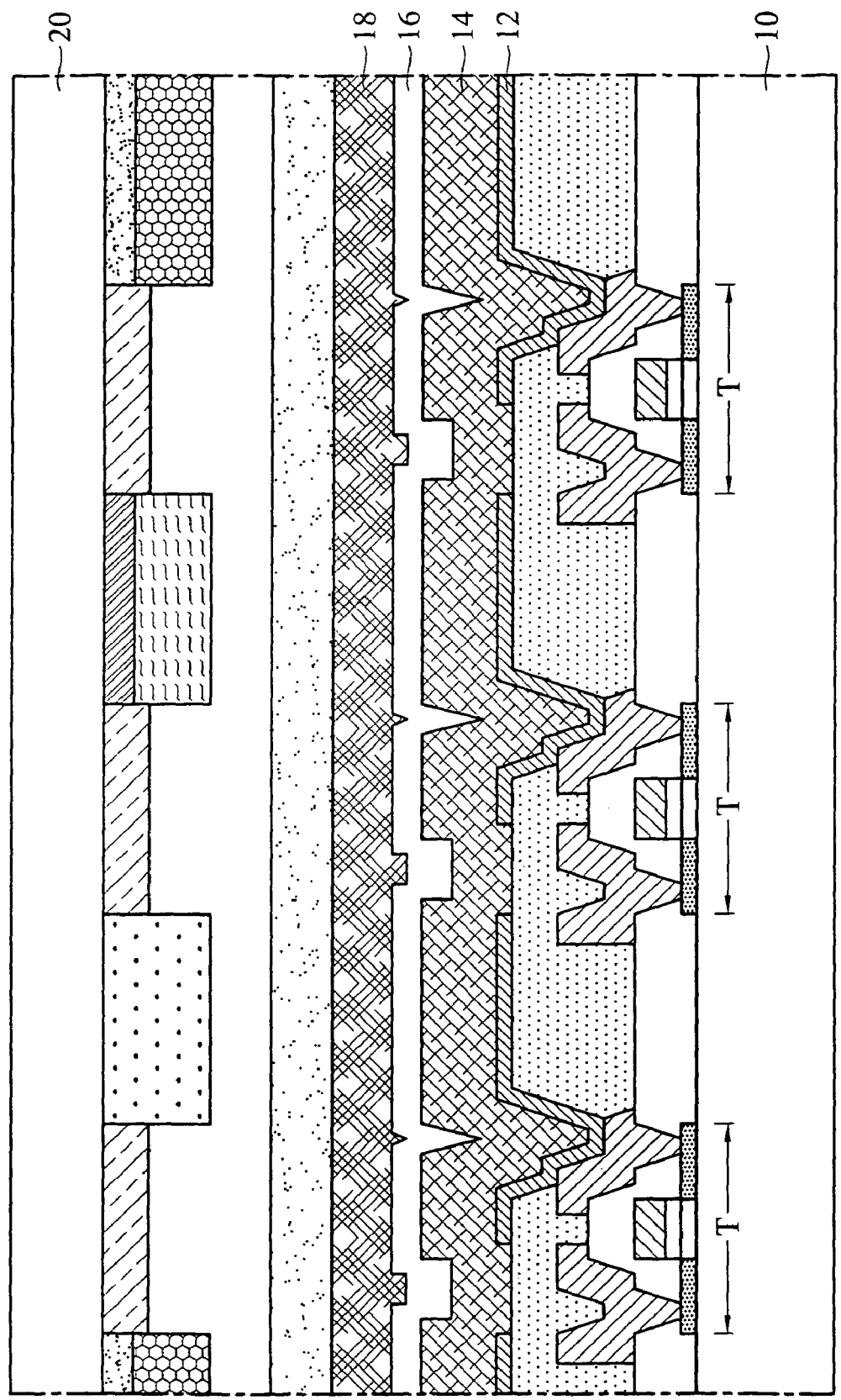
FIG. 1 depicts a cross sectional view of a conventional organic electroluminescent display device.
Figure 2A:
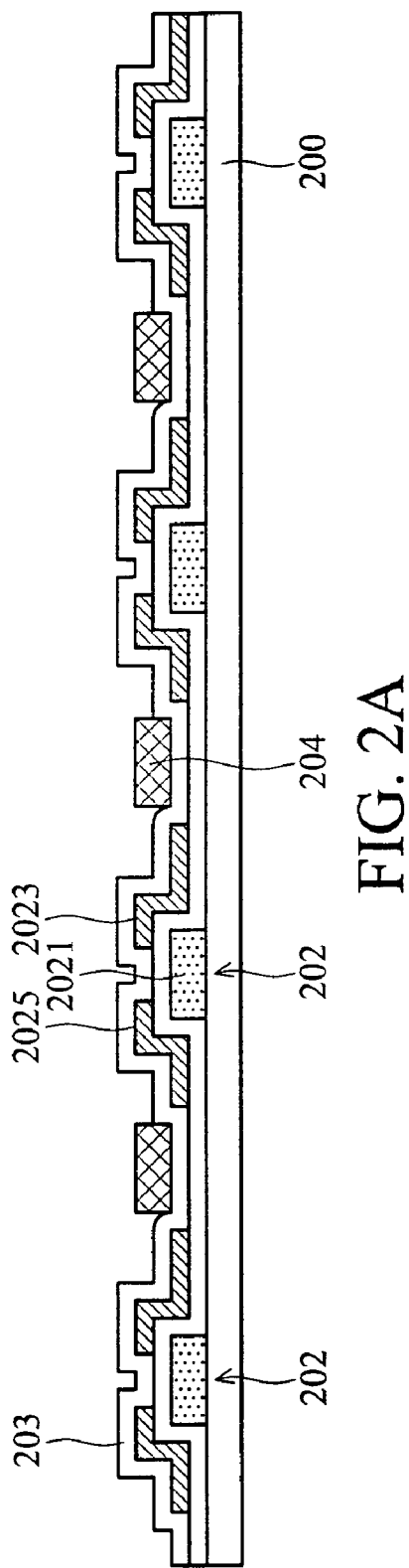
FIG. 2A through FIG. 2H depict cross sectional views of forming an organic electroluminescent display device according to first embodiment of the invention.

As shown in FIG. 2A, a color filter 204 is formed on a first substrate 200 having a plurality of thin film transistors (TFTs) 202 formed thereon. The first substrate 200 is transparent material, such as, glass or plastic. The flexible transparent material may also be used in first substrate 200.

The thin film transistor 202, serving as a switch, includes a gate electrode 2021, a source 2025 and drain 2023, in which the gate electrode 2021 is formed on the first substrate 200 followed by formation of the source 2025 and drain 2023 thereon. The gate electrode, source and drain may be formed by well known conventional methods, thus for brevity, description thereof is not provided in the following.

FIG. 2A, a dielectric layer 203 is formed on the first substrate 200 and covers the TFTs 202 for protection and isolation. In one embodiment, the dielectric layer 203, for example, silicon oxide, silicon nitride or other suitable dielectric material may be formed by chemical vapor deposition (CVD), such as, low-temperature chemical vapor deposition (LTCVD), plasma enhanced chemical vapor deposition (PECVD) or low-pressure chemical vapor deposition (LPCVD).

The color filter 204 is subsequently formed on the dielectric layer 203 on the first substrate 200, as shown in FIG. 2A. In one embodiment, the color filter 204 is disposed on a portion of the first substrate 200 under which no TFTs 202 are formed. Additionally, the TFTs 202 may serve as a shielding layer, for example, a black matrix (BM). Thus, the shielding layer may not necessarily be formed in the organic electroluminescent display device thus, fabrication cost may be reduced.

In some embodiments, the color filter 204, comprising red pigment, green pigment and blue pigment, is coated on the first substrate 200 by ink-jet printing (IJP). The color filter 204 is then baked. The color filter 204 is preferably an organic color photoresist or any suitable material serving as a color filter.

Figure 2B:
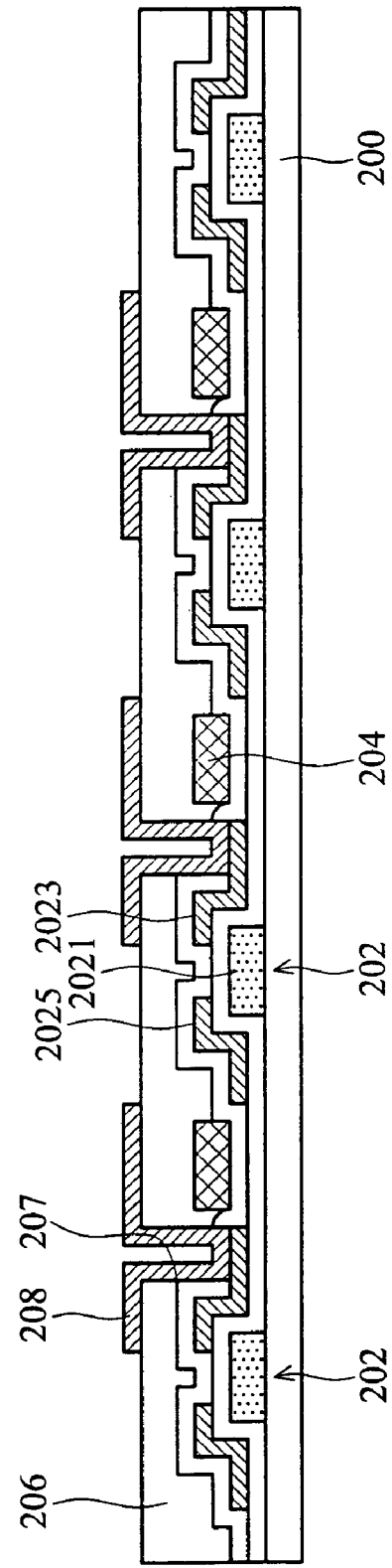

FIG. 2B, an overcoat layer 206 is formed on the first substrate 200, and covers the color filter 204 and TFTs 202 to planarize a surface of the first substrate 200. The overcoat layer 206 is preferably photosensitive material formed by spin-coating. The overcoat layer 206 is subsequently patterned, by photolithographic and etching processes to form a contact hole 207 exposing the drain 2023 of the TFTs 202.

After the contact hole 207 is formed, a first electrode 208 is formed on the overcoat layer 206 and extended to the contact hole 207 for electrically connecting to the drain 2023 of TFTs 202, as shown in FIG. 2B. In one embodiment, the first electrode 208 is preferably a transparent conductive layer, such as, indium tin oxide (ITO) formed by, for example, sputtering. Photolithographic and etching processes then pattern the conductive layer to form the first electrode 208. The first electrode 208 is correspondingly disposed on the color filter 204 formed on the first substrate 200. The first electrode 208 may act as an anode of a subsequent electroluminescent unit and is referred to as an anode electrode.

Figure 2C:
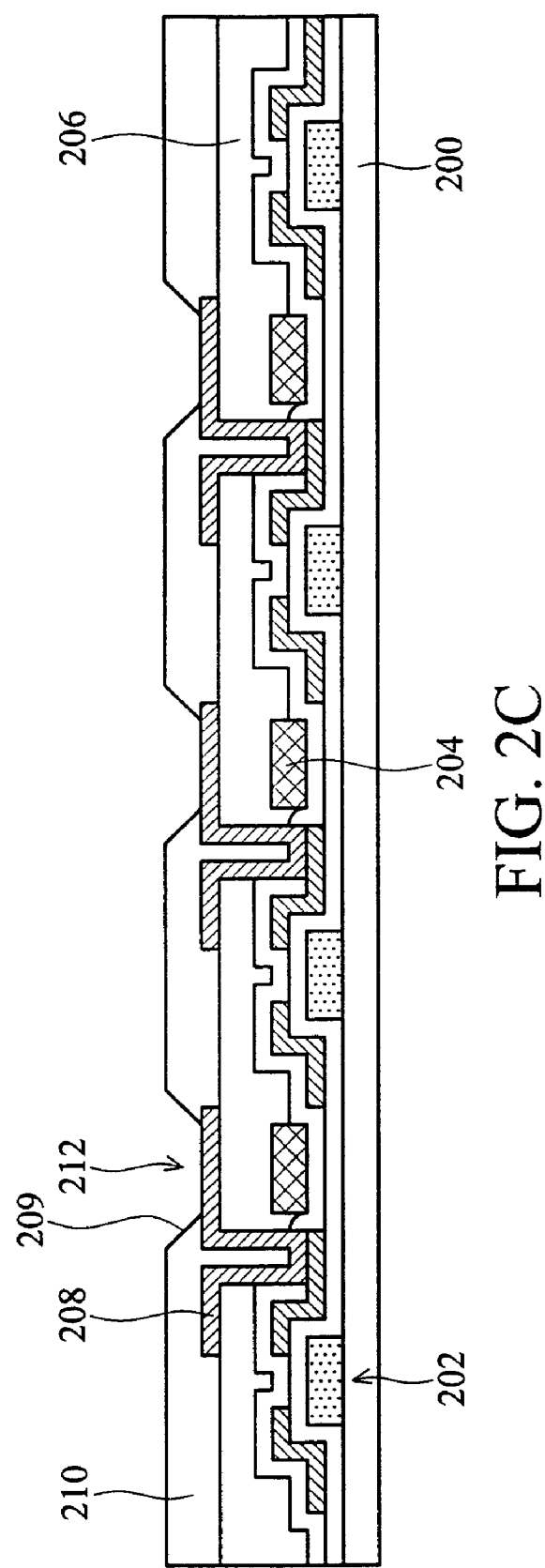

In FIG. 2C, a pixel define layer (PDL) 210 having a plurality of openings 209 is formed on the first substrate 200 to form a pixel area 212. The first electrode 208 is exposed by the openings 209. In one embodiment, a pixel define layer 210 of photosensitive material for example, is formed on the first substrate 200 and covers the first electrode 208 by, for example spin-coating. The pixel define layer 210 is patterned to form openings 209 exposing the first electrode 208.

Note that the pixel area 212 is correspondingly formed on the first electrode 208 and color filter 204. Additionally, a distance between top edges of the pixel area 212 is greater than or equal to a distance between bottom edges of the pixel area 212 in contact with the first electrode 208.

Figure 2D:
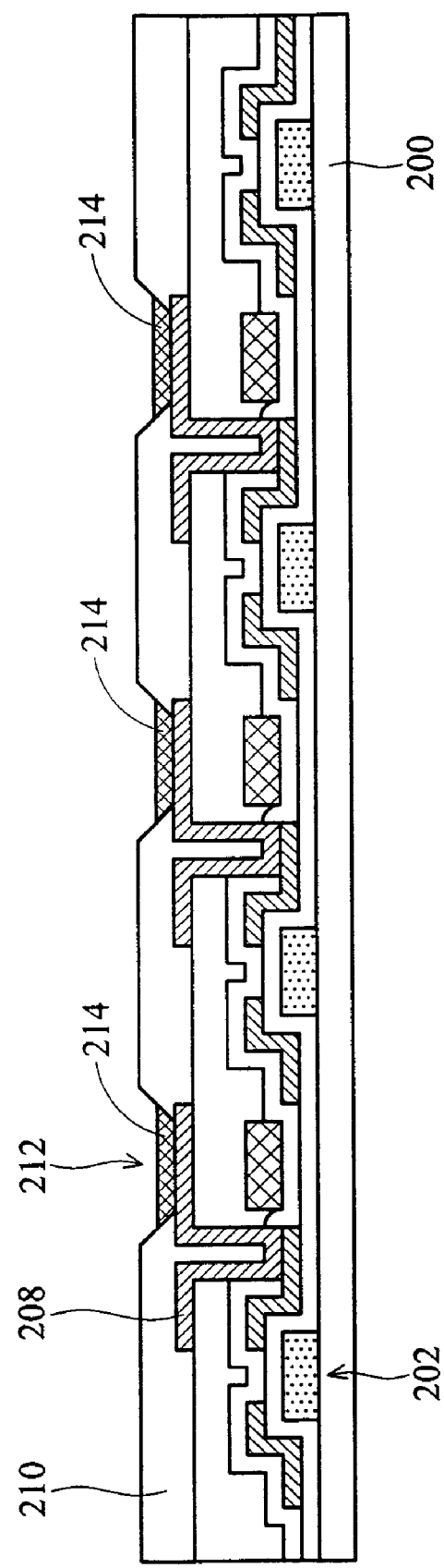

In FIG. 2D, an organic electroluminescent layer 214 is formed on the first electrode 208 inside the pixel area 212 to provide a light source for the organic electroluminescent display device. In one embodiment, the organic electroluminescent layer 214 may be, for example, a stack of a blue emitting layer, red emitting layer and green emitting layer or a blue emitting layer doped with yellow emitting material (or red emitting material) formed by, for example, vacuum evaporation to provide a white light for the organic electroluminescent display device. In another embodiment, a hole injection layer (not shown) and a hole transport layer (not shown) are sequentially formed on the first electrode 208 prior to formation of the organic electroluminescent layer 214. After the organic electroluminescent layer 214 is formed, an electron transport layer (not shown) and an electron injection layer (not shown) are formed on the organic electroluminescent layer 214.

Figure 2E:
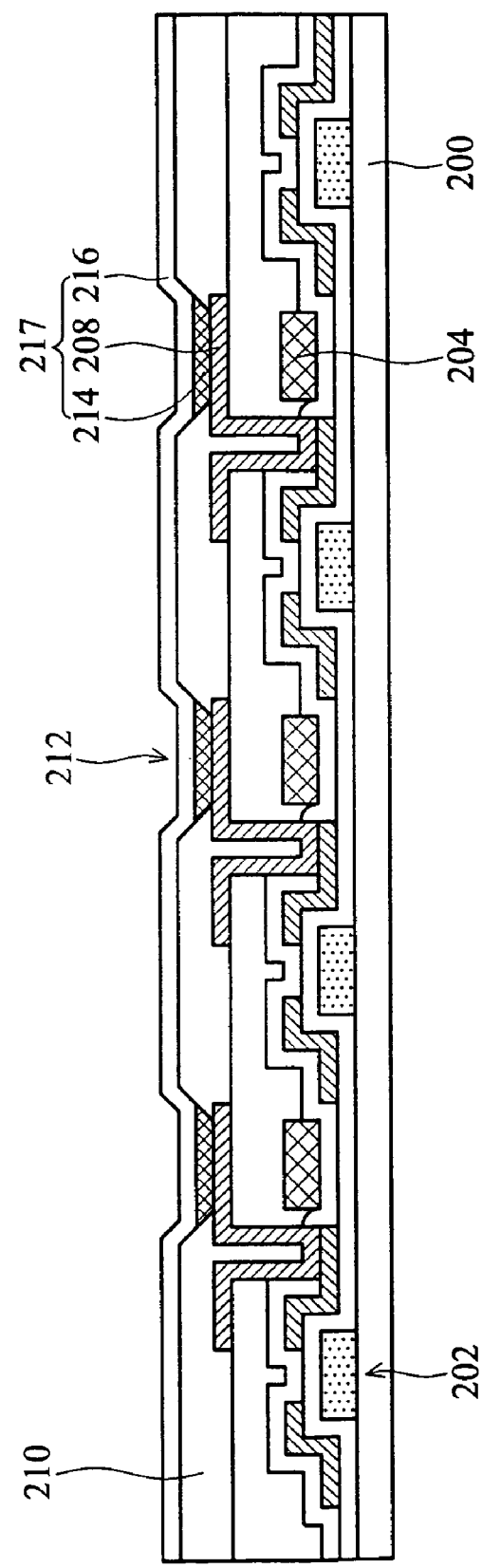

In FIG. 2E, a second electrode 216 is conformally formed on the first substrate 200 and covers the pixel define layer 210 and the organic electroluminescent layer 214. The second electrode 216, organic electroluminescent layer 214 and first electrode 208 inside the pixel area 212 constitute an electroluminescent unit 217, in which the second electrode 216 may act as a cathode electrode of the electroluminescent unit 217. In one embodiment, the second electrode 216 is, for example aluminum, aluminum-lithium alloys or magnesium-silver alloys, formed by sputtering, electron beam evaporation or thermal evaporation.

Note that the electroluminescent unit 217 comprising the first electrode 208, organic electroluminescent layer 214 and second electrode 216 is disposed on the color filter 204. While a current is provided to the electroluminescent unit 217, an electron provided by the second electrode 216 combines with a hole provided by the first electrode 208 in the organic electroluminescent layer 214 to emitting a light through the first electrode 208, color filter 204 and first substrate 200 and outside the organic electroluminescent display device.

Figure 2F:
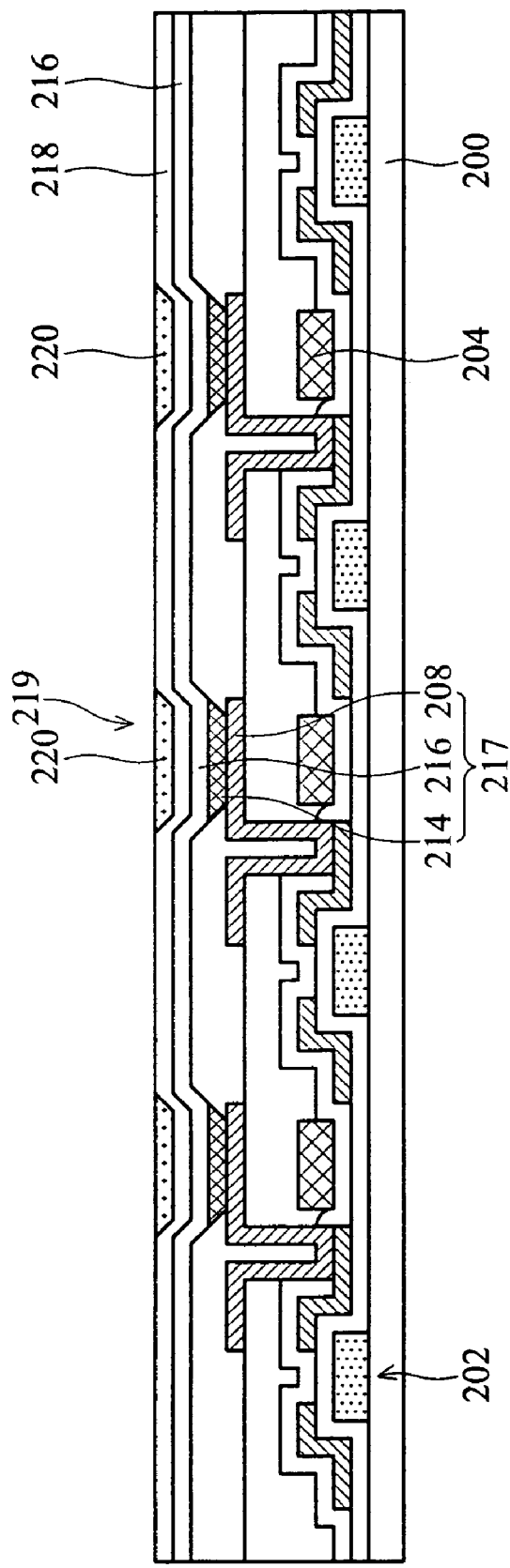

As shown is FIG. 2F, a first protective layer 218 is conformally formed on the second electrode 216. In one embodiment, the first protective layer 218 may be formed by, such as, vacuum evaporation, sputtering or plasmas enhanced chemical vapor deposition (PECVD) and have a thickness of between about 0.1 μm and 0.5 μm.

Preferably, the first protective layer 218 may be an inorganic material, for example, metal oxide, metal nitride, metal carbide, metal oxynitride or combinations thereof. The metal oxide is preferably silicon oxide ($SiO_x$), aluminum oxide ($Al2O_3$), titanium oxide ($TiO_2$), indium oxide ($In_2O_3$), tin oxide ($SnO_2$), indium tin oxide (ITO) or combinations thereof. The metal nitride is preferably aluminum nitride (AlN), silicon nitride (SiNx) or combinations thereof. The metal carbide may be silicon carbide (SiC) and the metal oxynitride may be silicon oxynitride (SiON).

FIG. 2F, a second protective layer 220 is then formed on the first protective layer 218 over the electroluminescent unit 217. The second protective layer 220 is disposed in a recess 209 over the electroluminescent unit 217. In some embodiments, the second protective layer 220 is coated on the first protective layer 218 by ink-jet printing (IJP). Note that a top surface of the second protective layer 220 and a top surface of the first protective layer 218 are substantially planar because the second protective layer 220 is disposed in the recess 209.

A curing step, for example, thermal curing or light curing is subsequently performed. The curing step is selected base on the material of the second protective layer 220. For example, if the second protective 220 is thermal-curable resin, a thermal process cures the second protective layer 220. In another example, if the second protective layer 220 is photosensitive (photo-curable) material, ultraviolet or visible light cures the second protective layer 220. In one embodiment, the second protective layer 220 may have a viscosity of between about 1 cp and 1000 cp. In another embodiment, the second protective layer 220 is formed in the recess 219 over the first protective layer 218 by screen printing.

Preferably, the second protective layer 220 may be a photo-curable material, for example, epoxy resin, or a thermal-curable material, such as, an acrylic-containing polymer. Note that a distance between top edges of the second protective layer 220 is greater than or equal to a distance between bottom edges of the second protective layer 220 in contact with the first protective layer 218. An upper surface of the second protective layer 220 is substantially planar to an upper surface of the first protective layer 218 because the second protective layer 220 is formed on the first protective layer 218 over the electroluminescent unit 217.

Figure 2G:
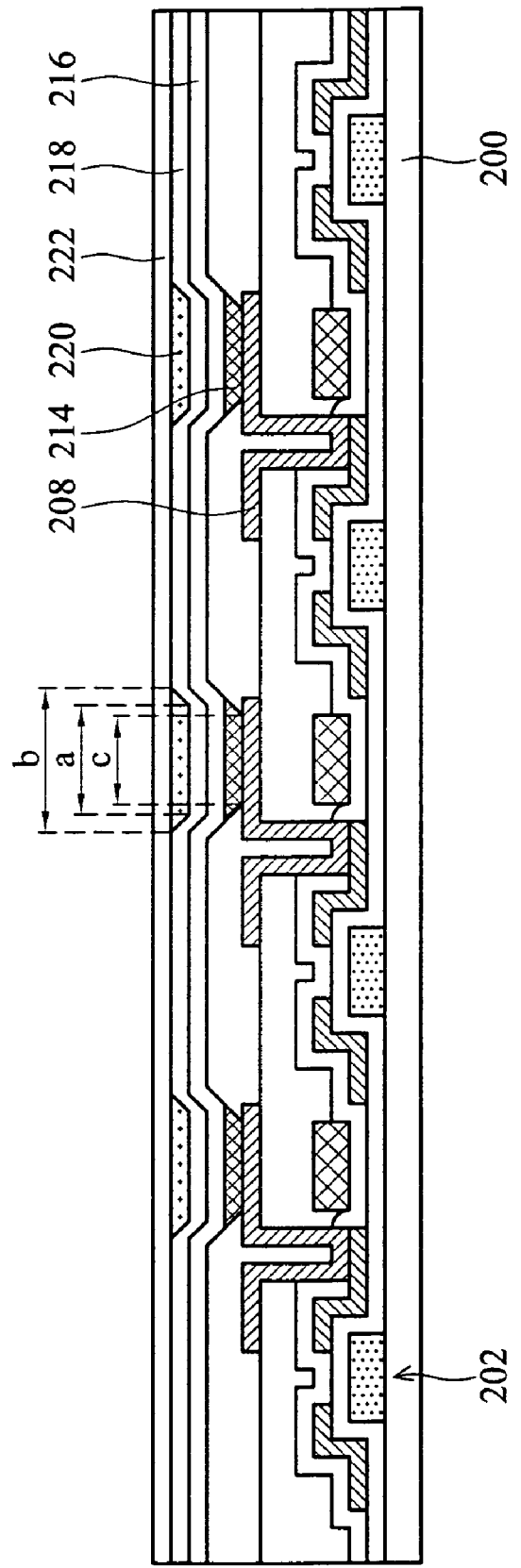

In FIG. 2G, a third protective layer 222 is formed on the first substrate 200, and contacts an upper surface of the first protective layer 218. In some embodiments, the third protective layer 222 may be formed on surfaces of the first protective layer 218 and the second protective layer 220 by vacuum evaporation, sputtering or plasmas enhanced chemical vapor deposition (PECVD). The third protective layer 222 preferably has a thickness of between about 0.1 μm and 0.5 μm. The third protective layer 222 may be a material similar to the first protective layer 218, thus, further description is not provided.

Note that a top area of the second protective layer 220 in contact with the third protective layer 222 is greater than or equal to a bottom area of the second protective layer 220 in contact with the first protective layer 218. That is, a distance (symbol b, as shown in FIG. 2G) between top edges of the second protective layer 220 in contact with the second protective layer 222 is greater than or equal to a distance (symbol a, as shown in FIG. 2G) between bottom edges of the second protective layer 220 in contact with the first protective layer 218, as shown in FIG. 2G. Additionally, the distance between bottom edges of the second protective layer 220 in contact with the first protective layer 218 is greater than or equal to a distance (symbol c, as shown in FIG. 2G) between bottom edges of the organic electroluminescent layer 214 in contact with the first electrode 208. That is, a bottom width of the second protective layer 220 is greater than or equal to a bottom width of the organic electroluminescent layer 214, as shown in FIG. 2G.

Note that the first protective layer 218, second protective layer 220 and third protective layer 222 in the first embodiment preferably comprises be transparent material as well as the second electrode 216.

Figure 2H:
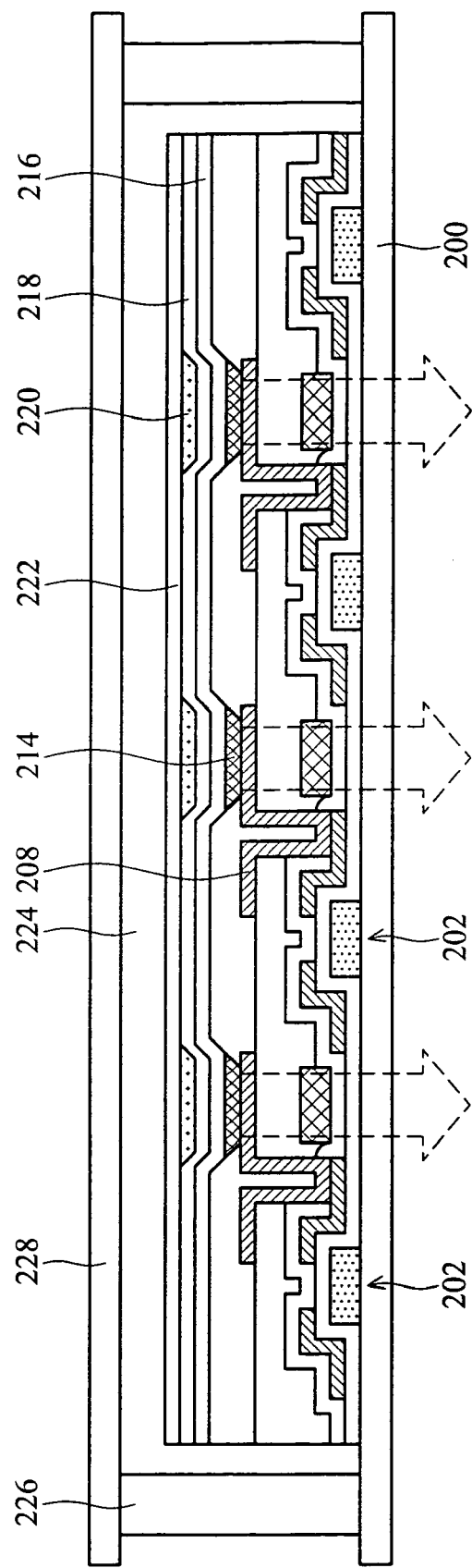

In FIG. 2H, a second substrate 228 is subsequently disposed correspondingly on the first substrate 200 by a sealant 226 under a vacuum or a nitrogen or argon containing atmosphere, and a buffer layer 224 is formed therebetween, thus completing fabrication of an organic electroluminescent display device of a first embodiment of the invention. The second substrate 228 may be a material similar to the first substrate 220, however, a plastic film serving as an encapsulating plate, for example, a plastic film with a waterproof layer may also be used. The sealant 226 is preferably a bonding agent containing epoxy.

When a current is provided to an electroluminescent unit, an electron provided by the second electrode combines with a hole provided by the first electrode in the organic electroluminescent layer to emit a light through the first electrode, color filter and the first substrate and exiting through the organic electroluminescent display device, as shown by the arrow in FIG. 2H.

The organic electroluminescent display device according to the embodiment of the invention effectively prevents infiltration of moisture into the electroluminescent unit because the first protective layer comprising inorganic material, the second protective layer comprising organic material and the third protective layer comprising inorganic material are formed on the electroluminescent unit. Additionally, forming the second protective layer comprising organic material between the first protective layer comprising inorganic material and the third protective layer comprising inorganic material relieves stress between the first and third layers. The second protective layer is only formed in the recess over the electroluminescent unit, thus, fabrication cost is reduced. Waterproof capability of the organic electroluminescent display device is enhanced without increasing total thickness of the organic electroluminescent display device because the second protective layer is formed in the recess over the electroluminescent unit. Thus, life of organic electroluminescent display device is increased.

FIG. 3A through FIG. 3F show cross sectional views of forming an organic electroluminescent display device according to second embodiment of the invention. In the second embodiment, color filter and thin film transistor are disposed on different substrates.

Figure 3A:
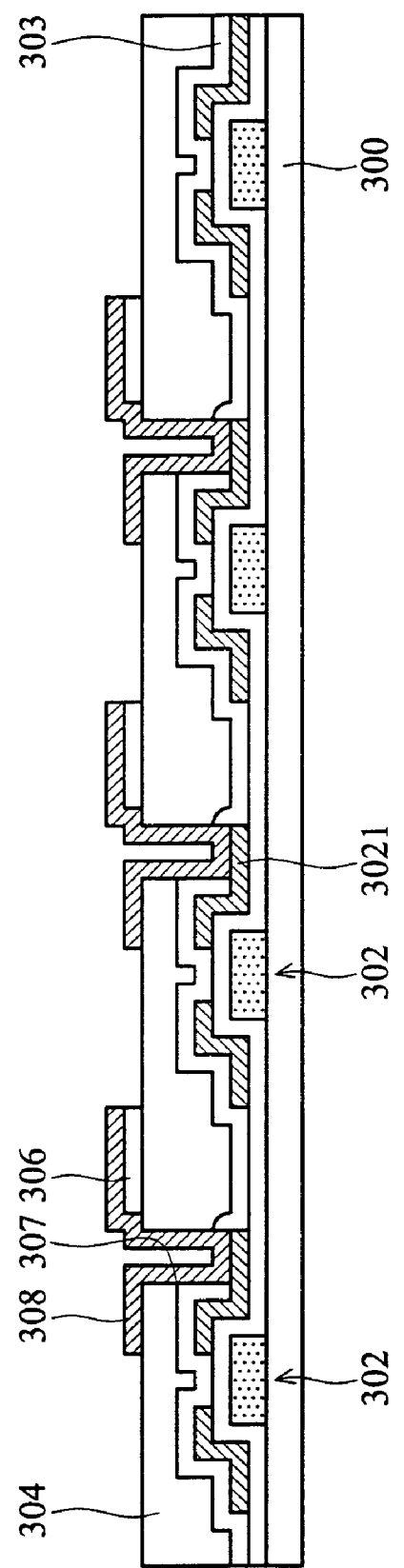
FIG. 3A through FIG. 3F depict cross sectional views of forming an organic electroluminescent display device according to second embodiment of the invention.

FIG. 3A, a reflective layer 306 is formed on a first substrate 300 having a plurality of thin film transistors (TFTs) 302, in which the reflective layer 306 is placed over a portion of the first substrate 300 under which no TFTs 302 are formed. A dielectric layer 303 and overcoat layer 304 are sequentially formed on the first substrate 300 and cover the TFTs 302 before the reflective layer 306 is formed. Formation and material of TFTs 302, dielectric layer 303 and overcoat layer 304 over the first substrate 300 may be similar to the first embodiment. In some embodiments, a metal layer, for example, aluminum is formed on the overcoat layer 304 over the first substrate 300 by, for example, sputtering or evaporation. The metal layer is then patterned to form the reflective layer 306 on a portion of the first substrate 300 on which no TFTs 302 are formed.

In FIG. 3A, a first electrode 308 is formed on the reflective layer 306 and electrically connected a drain 3021 of the TFTs 302 by passing through a contact hole 307. In some embodiments, the reflective layer 306 and a portion of the overcoat layer 304 is masked by a patterned photoresist (not shown) followed by removing a portion of the overcoat layer 304 and dielectric layer 303 to form the contact hole 307 for exposing the drain 3021 of the TFTs 302. A transparent conductive layer, for example, indium tin oxide (ITO) is then formed on the overcoat layer 304 and covers the reflective layer 306 after removing the patterned photoresist. Thereafter, the transparent conductive layer is patterned to form the first electrode 308 on the reflective layer 306 and electrically connect to the drain 3021 of the TFTs 302 by passing through the contact hole 307. The formation and material of the first electrode 208 is preferably similar to the first embodiment. The first electrode may function as an anode electrode for a subsequently formed electroluminescent unit.

Figure 3B:
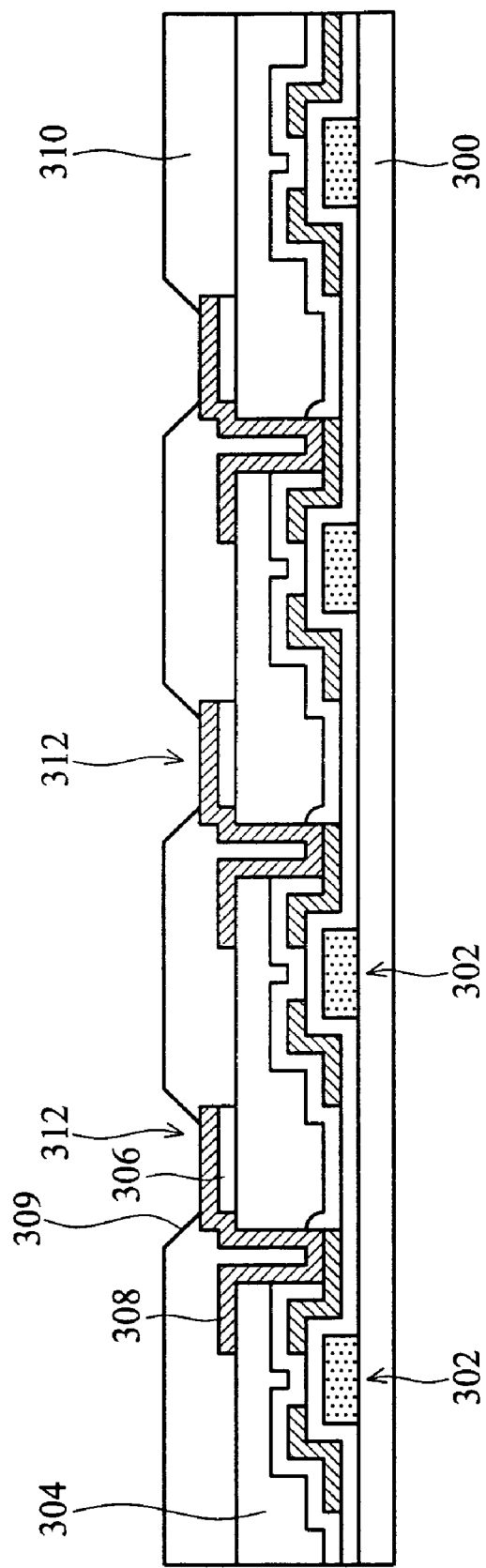

FIG. 3B, a pixel define layer 310 having a plurality of openings 309 is formed on the first substrate 300 to form a pixel area 312. The first electrode 308 over the reflective layer 306 is exposed by the openings 309. Preferably, a distance between top edges of the pixel area 312 is greater than or equal to a distance between bottom edges of the pixel area 312 in contact with the first electrode 308. Formation and material of the pixel define layer 310 may be the same as the first embodiment, thus, further description is not provided.

Figure 3C:
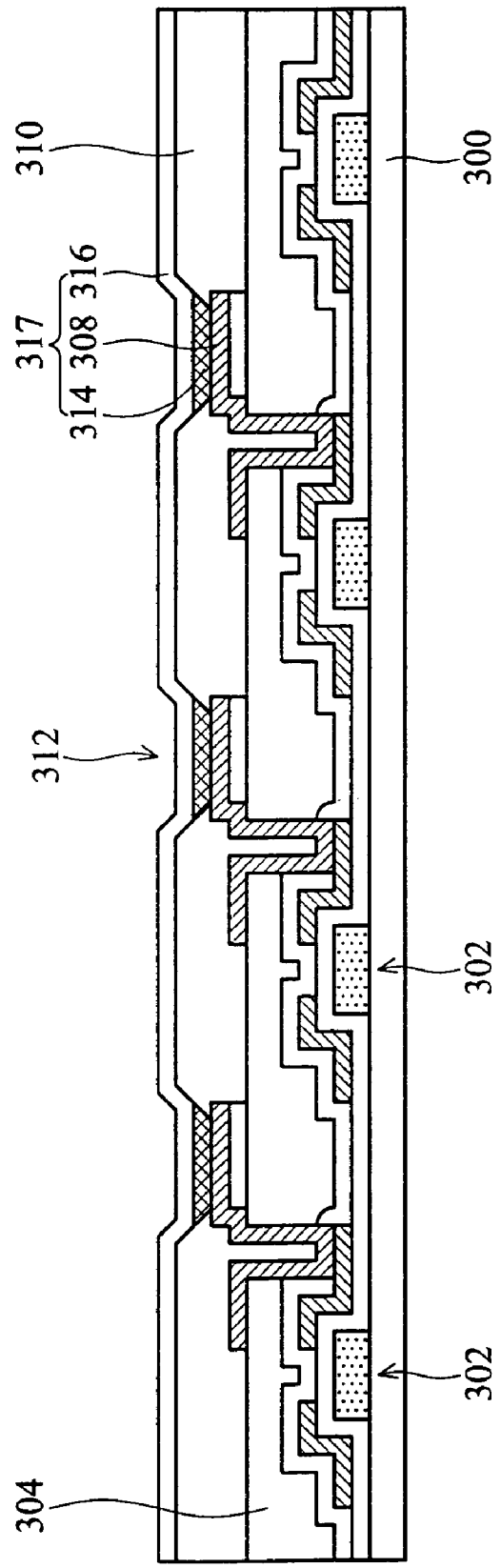

FIG. 3C, an organic electroluminescent layer 314 is formed in the pixel area 312 followed by covering a second electrode 316 on the organic electroluminescent layer 314 and the pixel define layer 310. The first electrode 316, the organic electroluminescent layer 314 and the second electrode 316 in the pixel area 312 constitute an electroluminescent unit 317, in which the first and second electrodes 308 and 316 serve as an anode and cathode, respectively. Formation and material of the organic electroluminescent layer 314 and second electrode 316 may be similar to the first embodiment.

Figure 3D:
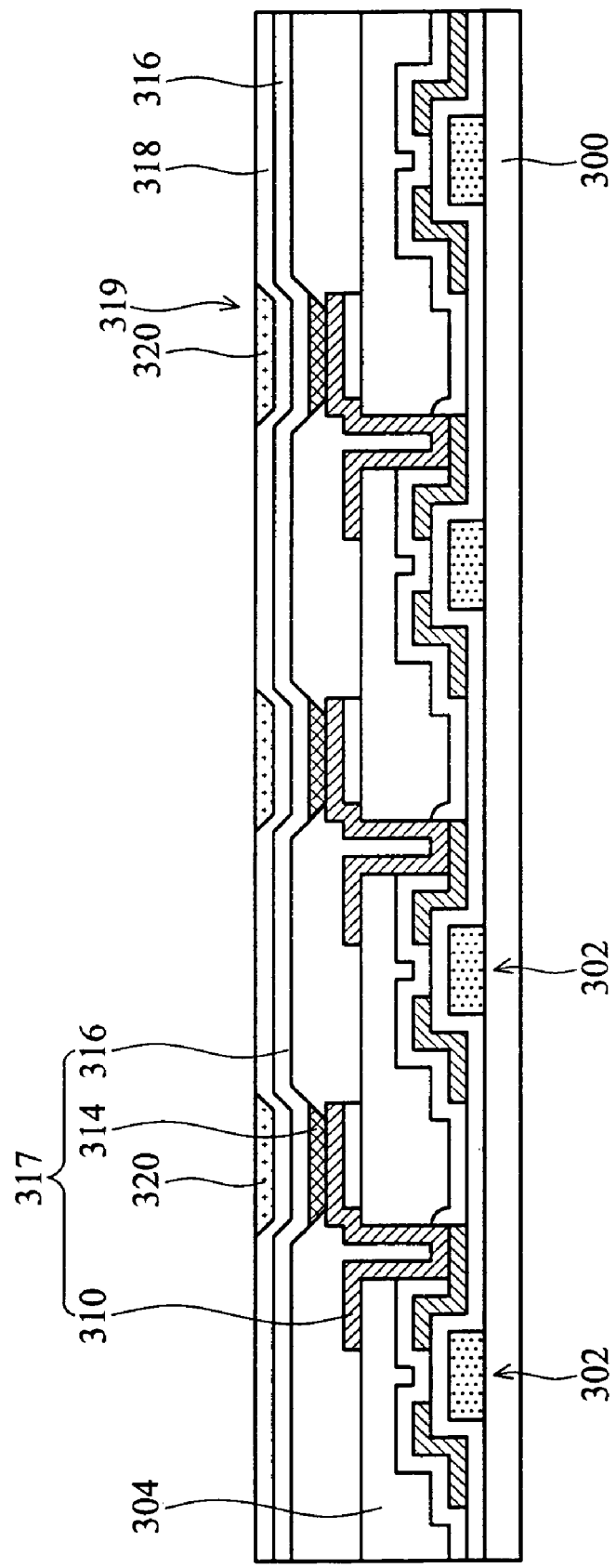

As shown in FIG. 3D, a first protective layer 318 is formed on the second electrode 316 followed by formation of a second protective layer 320 on the first protective layer 318 over the electroluminescent unit 317. Preferably, the first protective layer 318 may be, for example, inorganic material similar to first embodiment formed on the second electrode 316 by vacuum evaporation, sputtering or plasma enhanced chemical vapor deposition. The first protective layer has a preferably thickness of between about 0.1 μm and 0.5 μm.

In some embodiments, the second protective layer 320, for example, organic material is coated on the first protective layer 318 over the electroluminescent unit 317 by ink-jet printing (IJP). Thereafter, a curing step, for example, thermal curing or light curing is performed to cure the protective layer 320 in a recess 319 over the electroluminescent unit 317. The curing step is selected based on material of the second protective layer 320. For example, the second protective layer 320 is cured by thermal process, when the second protective layer 320 is thermal-curing resin. In another example, the second protective layer 320 is cured by ultraviolet or visible light, when the second protective layer 320 is photosensitive material. In one embodiment, the second protective layer 320 may have a viscosity of between about 1 cp and 1000 cp. In another embodiment, the second protective layer 320 may be formed inside the recess 319 of the protective layer 310 over electroluminescent unit 317 by screen printing. Note that an upper surface of the second protective layer 320 and an upper surface of the first protective layer 318 are substantially planar because the second protective layer 320 is disposed in the recess 319. The second protective layer 320 may comprises a material similar to the first embodiment, thus, further description is not provided.

Figure 3E:
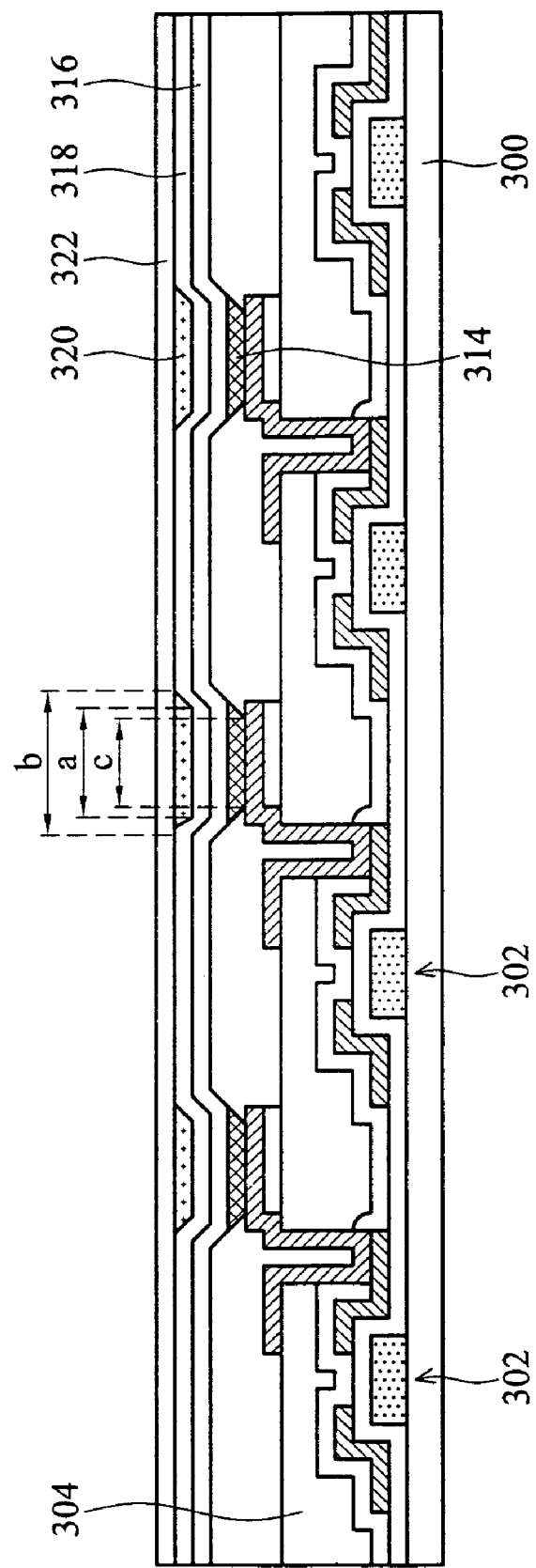

In FIG. 3E, a third protective layer 322, for example inorganic material, is formed on the first substrate 300 and contacts surfaces of the first protective layer 318 and second protective layer 320. Preferably, the third protective layer 322 has thickness of between about 0.1 μm and 0.5 μm. Formation and material of the third protective layer 320 may be the same as that of the first embodiment.

Note that a top area of the second protective layer 320 in contact with the third protective layer 322 is greater than or equal to a bottom area of the second protective layer 320 in contact with the first protective layer 318. That is, a distance (symbol b as shown in FIG. 3E) between top edges of the second protective layer 320 in contact with the third protective layer 322 is greater than or equal to one (symbol a as shown in FIG. 3E) between bottom edges of the second protective layer 320 in contact with the first protective layer 318, as shown in FIG. 3E. Additionally, the distance between bottom edges of the second protective layer 320 in contact with the first protective layer 318 is greater than or equal to a distance (symbol c as shown in FIG. 3E) between bottom edges of the organic electroluminescent layer 314 in contact with the first electrode 308. That is, a bottom width (symbol a as shown in FIG. 3E) of the second protective layer 320 is greater than or equal to a bottom width (symbol c as shown in FIG. 3E) of the organic electroluminescent layer 314.

Figure 3F:
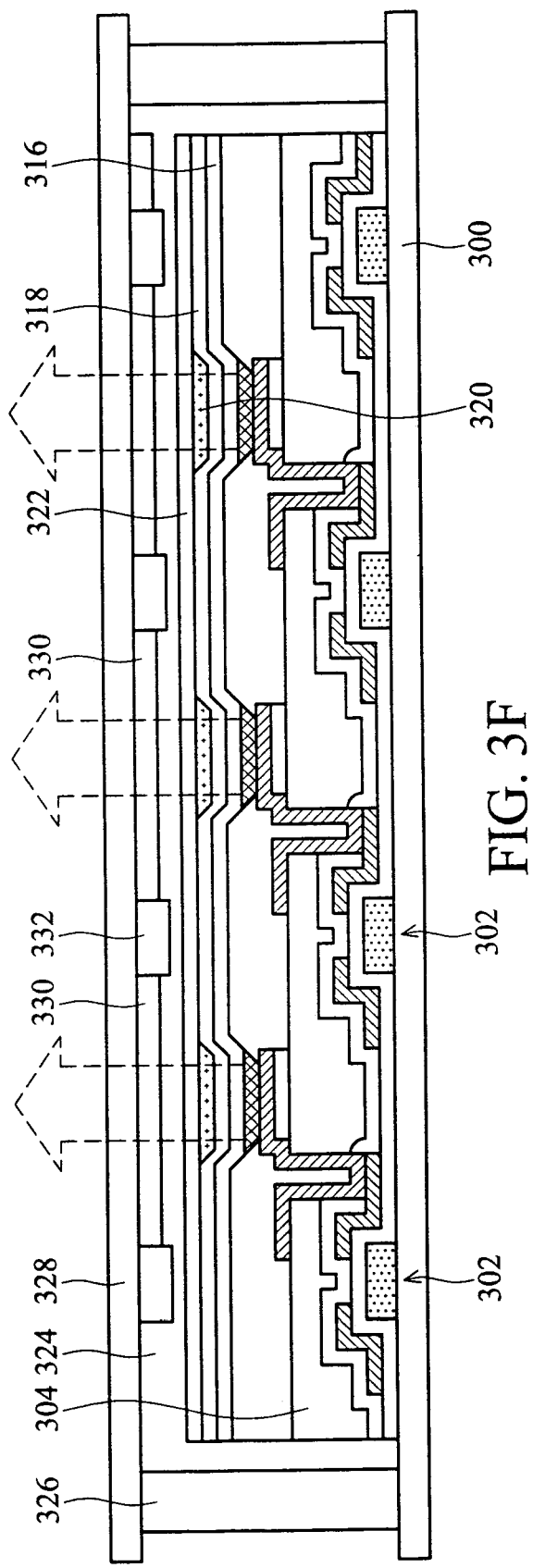

FIG. 3F, a second substrate 328 having a color filter 330 thereon, is then correspondingly disposed on the first substrate 300 by a sealant 326 under a vacuum or a nitrogen or argon containing atmosphere and a buffer layer 324 is formed therebetween, completing fabrication of an organic electroluminescent display device according to the second embodiment of the invention. The second substrate 328 may be similar to the first substrate 300 or may be a plastic film with waterproof film. The sealant 326 is preferably a bonding agent containing epoxy. The color filter 330 is correspondingly disposed over the electroluminescent unit in the pixel area and separated by a shielding layer 332, for example black matrix. Formation or material of the color filter 300 may be similar to first embodiment or any suitable formation or material known to those skilled in the art.

When a current is provided to an electroluminescent unit, an electron provided by the second electrode (also referred to as cathode) combines with a hole provided by the first electrode (also referred to as anode) in the organic electroluminescent layer to emit a light through the first electrode, color filter and the first substrate and the organic electroluminescent display device, as shown by an arrow in FIG. 3F. A portion of the light through the first electrode may, however, be reflected by the reflective layer, to then exit the organic electroluminescent display device by way of the described path.

The organic electroluminescent display device according to second embodiment of the invention effectively prevents oxidation of electrodes by infiltration of moisture into the electroluminescent unit. Because the first protective layer comprising inorganic material, the second protective layer comprising organic material and the third protective layer comprising inorganic material are formed on the electroluminescent unit to prevent moisture infiltration. Additionally, a stress between the first protective layer comprising inorganic material and the third protective layer comprising inorganic material is reduced by forming the second protective layer comprising organic material therebetween. Furthermore, the second protective layer is only formed in the recess over the electroluminescent unit, thus, fabrication cost is reduced. Furthermore, waterproof ability of the organic electroluminescent display device is enhanced without increasing thickness of the organic electroluminescent display device because the second protective layer is formed in the recess over the electroluminescent unit, thus, life is increased.

Note that the first protective layer, second protective layer and third protective layer is preferably a transparent material and the second electrode may be transparent material as well.

Figure 4:
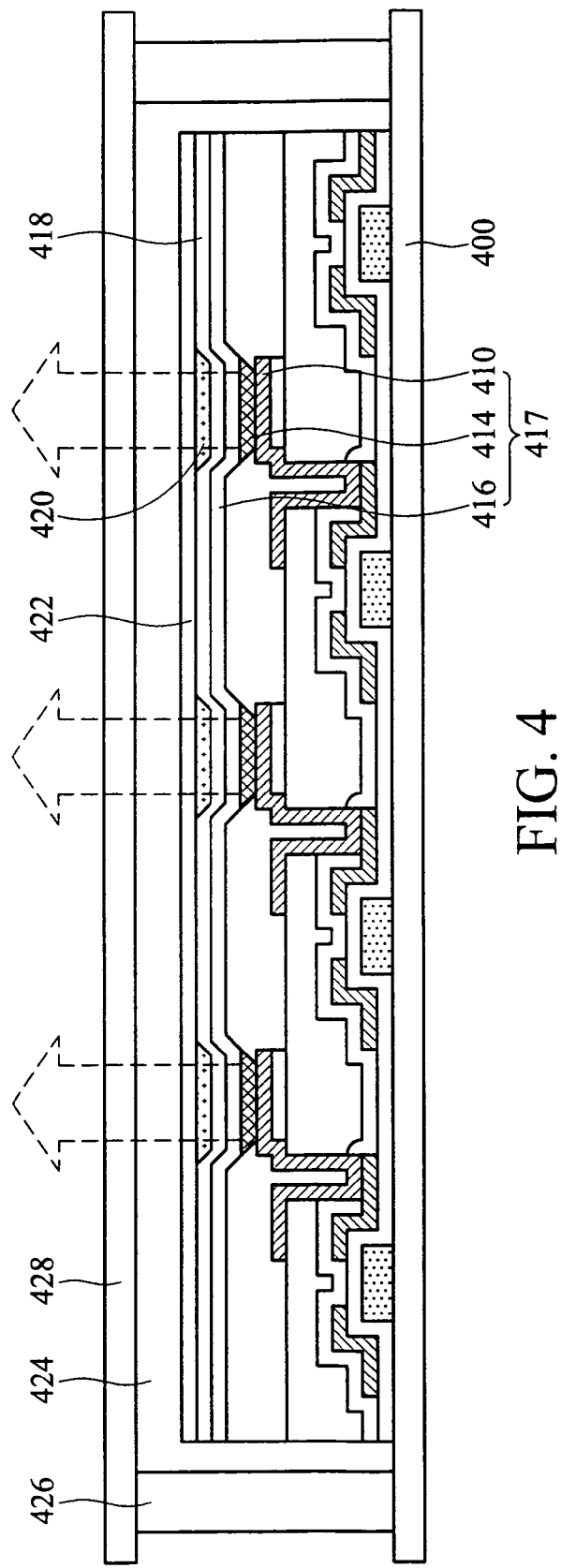
FIG. 4 depicts cross sectional view of an organic electroluminescent display device according to third embodiment of the invention.

FIG. 4 shows a cross sectional view of an organic electroluminescent display device according to third embodiment of the invention. Compare with second embodiment, difference is that a color filter may be function as a second protective layer, thus, similar element and formation can refer to above.

In FIG. 4, a first protective layer 418 is formed on a second electrode 416, after a first electrode 410, an organic electroluminescent layer 414 and the second electrode 416 is formed on a first substrate 400. Formation and material of the first protective layer 418 may be similar to the second embodiment. A second protective layer 420 comprising an organic color photoresist is formed on the electroluminescent unit 417 to function as a color filter. Preferably, is the described ink-jet printing or screen printing forms the second protective layer 420.

A third protective layer 422 is then formed on the second protective layer 420 and in contact with the first protective layer 418 after the second protective layer 420 is formed. Finally, a second substrate 428 is sealed to the first substrate 400 by a sealant 426. A buffer layer 424 is filled between the first substrate 400 and second substrate 428, to complete an organic electroluminescent display device according to a third embodiment of the invention, as shown in FIG. 4.

Note that color filter and shielding layer is not necessarily formed on the second substrate, thus, steps of fabrication and cost of material utilized are reduced. A stress between the first protective layer comprising an inorganic material and third protective layer comprising an inorganic material is reduced because the second protective layer comprises an organic photoresist. Note that the second protective layer in first embodiment may be a material of organic color photoresist function as protective layer and color filter to reduce fabrication cost, although it is not described here.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent display device, comprising:
    a first substrate having at least one thin film transistor;
    an electroluminescent unit formed on the first substrate and electrically connected to the thin film transistor;
    a first protective layer formed on the electroluminescent unit;
    a second protective layer formed on the first protective layer, wherein the first protective layer defines a recess over the electroluminescent unit, wherein the second protective layer fills the recess and is contained entirely in the recess, such that a top surface of the second protective layer is substantially co-planar with a top surface of the first protective layer; and
    a third protective layer formed on the second protective layer and in contact with the first protective layer.

2. The device as claimed in claim 1, wherein the first protective layer and the third protective layer comprise silicon oxide, aluminum oxide, titanium dioxide, indium oxide, tin oxide, indium tin oxide, aluminum nitride, silicon nitride, silicon carbide or silicon oxynitride.

3. The device as claimed in claim 1, wherein the second protective layer comprises an organic material.

4. The device as claimed in claim 1, wherein the second protective layer comprises epoxy resin or acrylic-containing polymer.

5. The device as claimed in claim 1, wherein the second protective layer comprises color photoresist.

6. The device as claimed in claim 1, wherein a top area of the second protective layer in contact with the third protective layer is greater than or equal to a bottom area of the second protective layer in contact with the first protective layer.

7. The device as claimed in claim 1, wherein a distance between top edges of the second protective layer in contact with the third protective layer is greater than or equal to a distance between bottom edges of the second protective layer in contact with the first protective layer.

8. The device as claimed in claim 1, further comprising:
    a pixel define layer having a pixel area, formed on the first substrate; and
    an organic electroluminescent layer disposed in the pixel area.

9. The device as claimed in claim 8, wherein a bottom width of the second protective layer is greater than or equal to a bottom width of the organic electroluminescent layer.

10. The device as claimed in claim 8, further comprising:
    a color filter layer formed on a portion of the first substrate under the pixel area; and
    a second substrate sealed over a surface of the first substrate having the electroluminescent unit formed thereon.

11. The device as claimed in claim 8, further comprising:
    a second substrate correspondingly sealed over a surface of the first substrate having the electroluminescent unit formed thereon;
    a color filter layer formed on the second substrate and corresponding to the pixel area; and
    a reflective layer disposed on a portion of the first substrate under the pixel area.

* * * * *